(12) United States Patent
Berry et al.

(10) Patent No.: US 7,507,603 B1
(45) Date of Patent: Mar. 24, 2009

(54) ETCH SINGULATED SEMICONDUCTOR PACKAGE

(75) Inventors: Christopher J. Berry, Chandler, AZ (US); Christopher M. Scanlan, Chandler, AZ (US); Faheem F. Faheem, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 112 days.

(21) Appl. No.: 11/292,778

(22) Filed: Dec. 2, 2005

(51) Int. Cl.
*H01L 21/00* (2006.01)
(52) U.S. Cl. ................ 438/113; 438/111; 257/E21.599
(58) Field of Classification Search ......... 438/110–112, 438/113
See application file for complete search history.

(56) References Cited

U.S. PATENT DOCUMENTS

| | | | |
|---|---|---|---|
| 2,596,993 A | 5/1952 | Gookin |
| 3,435,815 A | 4/1969 | Forcier |
| 3,734,660 A | 5/1973 | Davies et al. |
| 3,838,984 A | 10/1974 | Crane et al. |
| 4,054,238 A | 10/1977 | Lloyd et al. |
| 4,189,342 A | 2/1980 | Kock |
| 4,258,381 A | 3/1981 | Inaba |
| 4,289,922 A | 9/1981 | Devlin |
| 4,301,464 A | 11/1981 | Otsuki et al. |
| 4,332,537 A | 6/1982 | Slepcevic |
| 4,417,266 A | 11/1983 | Grabbe |
| 4,451,224 A | 5/1984 | Harding |
| 4,530,152 A | 7/1985 | Roche et al. |
| 4,541,003 A | 9/1985 | Otsuka et al. |
| 4,646,710 A | 3/1987 | Schmid et al. |
| 4,707,724 A | 11/1987 | Suzuki et al. |
| 4,727,633 A | 3/1988 | Herrick |
| 4,737,839 A | 4/1988 | Burt |
| 4,756,080 A | 7/1988 | Thorp, Jr. et al. |
| 4,812,896 A | 3/1989 | Rothgery et al. |
| 4,862,245 A | 8/1989 | Pashby et al. |
| 4,862,246 A | 8/1989 | Masuda et al. |
| 4,907,067 A | 3/1990 | Derryberry |
| 4,920,074 A | 4/1990 | Shimizu et al. |
| 4,935,803 A | 6/1990 | Kalfus et al. |
| 4,942,454 A | 7/1990 | Mori et al. |
| 4,987,475 A | 1/1991 | Schlesinger et al. |

(Continued)

FOREIGN PATENT DOCUMENTS

DE 19734794 A1 8/1997

(Continued)

OTHER PUBLICATIONS

National Semiconductor Corporation, "Leadless Leadframe Package," Informational Pamphlet from webpage, 21 pages, Oct. 2002, www.national.com.

(Continued)

*Primary Examiner*—David A Zarneke
(74) *Attorney, Agent, or Firm*—Stetina Brunda Garred & Brucker

(57) ABSTRACT

In accordance with the present invention, there is provided various methods of simultaneously fabricating a plurality of semiconductor packages (e.g., cavity type semiconductor packages) wherein the singulation process is achieved using etching techniques as opposed to more conventional cutting techniques such as sawing or punching. Such etching techniques are inherently lower in cost and free from many of the defects induced by other cutting techniques.

20 Claims, 4 Drawing Sheets

U.S. PATENT DOCUMENTS

| | | | |
|---|---|---|---|
| 5,018,003 A | 5/1991 | Yasunaga |
| 5,029,386 A | 7/1991 | Chao et al. |
| 5,041,902 A | 8/1991 | McShane |
| 5,057,900 A | 10/1991 | Yamazaki |
| 5,059,379 A | 10/1991 | Tsutsumi et al. |
| 5,065,223 A | 11/1991 | Matsuki et al. |
| 5,070,039 A | 12/1991 | Johnson et al. |
| 5,087,961 A | 2/1992 | Long et al. |
| 5,091,341 A | 2/1992 | Asada et al. |
| 5,096,852 A | 3/1992 | Hobson |
| 5,118,298 A | 6/1992 | Murphy |
| 5,122,860 A | 6/1992 | Kichuchi et al. |
| 5,134,773 A | 8/1992 | LeMaire et al. |
| 5,151,039 A | 9/1992 | Murphy |
| 5,157,475 A | 10/1992 | Yamaguchi |
| 5,157,480 A | 10/1992 | McShane et al. |
| 5,168,368 A | 12/1992 | Gow, 3rd et al. |
| 5,172,213 A | 12/1992 | Zimmerman |
| 5,172,214 A | 12/1992 | Casto |
| 5,175,060 A | 12/1992 | Enomoto et al. |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,218,231 A | 6/1993 | Kudo |
| 5,221,642 A | 6/1993 | Burns |
| 5,250,841 A | 10/1993 | Sloan et al. |
| 5,252,853 A | 10/1993 | Michii |
| 5,258,094 A | 11/1993 | Furui et al. |
| 5,266,834 A | 11/1993 | Nishi et al. |
| 5,273,938 A | 12/1993 | Lin et al. |
| 5,277,972 A | 1/1994 | Sakumoto et al. |
| 5,278,446 A | 1/1994 | Nagaraj et al. |
| 5,279,029 A | 1/1994 | Burns |
| 5,281,849 A | 1/1994 | Singh Deo et al. |
| 5,294,897 A | 3/1994 | Notani et al. |
| 5,327,008 A | 7/1994 | Djennas et al. |
| 5,332,864 A | 7/1994 | Liang et al. |
| 5,335,771 A | 8/1994 | Murphy |
| 5,336,931 A | 8/1994 | Juskey et al. |
| 5,343,076 A | 8/1994 | Katayama et al. |
| 5,358,905 A | 10/1994 | Chiu |
| 5,365,106 A | 11/1994 | Watanabe |
| 5,381,042 A | 1/1995 | Lerner et al. |
| 5,391,439 A | 2/1995 | Tomita et al. |
| 5,406,124 A | 4/1995 | Morita et al. |
| 5,410,180 A | 4/1995 | Fujii et al. |
| 5,414,299 A | 5/1995 | Wang et al. |
| 5,417,905 A | 5/1995 | LeMaire et al. |
| 5,424,576 A | 6/1995 | Djennas et al. |
| 5,428,248 A | 6/1995 | Cha |
| 5,435,057 A | 7/1995 | Bindra et al. |
| 5,444,301 A | 8/1995 | Song et al. |
| 5,452,511 A | 9/1995 | Chang |
| 5,454,905 A | 10/1995 | Fogelson |
| 5,474,958 A | 12/1995 | Djennas et al. |
| 5,484,274 A | 1/1996 | Neu |
| 5,493,151 A | 2/1996 | Asada et al. |
| 5,508,556 A | 4/1996 | Lin |
| 5,517,056 A | 5/1996 | Bigler et al. |
| 5,521,429 A | 5/1996 | Aono et al. |
| 5,528,076 A | 6/1996 | Pavio |
| 5,534,467 A | 7/1996 | Rostoker |
| 5,539,251 A | 7/1996 | Iverson et al. |
| 5,543,657 A | 8/1996 | Diffenderfer et al. |
| 5,544,412 A | 8/1996 | Romero et al. |
| 5,545,923 A | 8/1996 | Barber |
| 5,581,122 A | 12/1996 | Chao et al. |
| 5,592,019 A | 1/1997 | Ueda et al. |
| 5,592,025 A | 1/1997 | Clark et al. |
| 5,594,274 A | 1/1997 | Suetaki |
| 5,595,934 A | 1/1997 | Kim |
| 5,604,376 A | 2/1997 | Hamburgen et al. |
| 5,608,265 A | 3/1997 | Kitano et al. |
| 5,608,267 A | 3/1997 | Mahulikar et al. |
| 5,625,222 A | 4/1997 | Yoneda et al. |
| 5,633,528 A | 5/1997 | Abbott et al. |
| 5,639,990 A | 6/1997 | Nishihara et al. |
| 5,640,047 A | 6/1997 | Nakashima |
| 5,641,997 A | 6/1997 | Ohta et al. |
| 5,643,433 A | 7/1997 | Fukase et al. |
| 5,644,169 A | 7/1997 | Chun |
| 5,646,831 A | 7/1997 | Manteghi |
| 5,650,663 A | 7/1997 | Parthasaranthi |
| 5,661,088 A | 8/1997 | Tessier et al. |
| 5,665,996 A | 9/1997 | Williams et al. |
| 5,673,479 A | 10/1997 | Hawthorne |
| 5,683,806 A | 11/1997 | Sakumoto et al. |
| 5,689,135 A | 11/1997 | Ball |
| 5,696,666 A | 12/1997 | Miles et al. |
| 5,701,034 A | 12/1997 | Marrs |
| 5,703,407 A | 12/1997 | Hori |
| 5,710,064 A | 1/1998 | Song et al. |
| 5,723,899 A | 3/1998 | Shin |
| 5,724,233 A | 3/1998 | Honda et al. |
| 5,726,493 A | 3/1998 | Yamashita |
| 5,736,432 A | 4/1998 | Mackessy |
| 5,745,984 A | 5/1998 | Cole, Jr. et al. |
| 5,753,532 A | 5/1998 | Sim |
| 5,753,977 A | 5/1998 | Kusaka et al. |
| 5,766,972 A | 6/1998 | Takahashi et al. |
| 5,770,888 A | 6/1998 | Song et al. |
| 5,776,798 A | 7/1998 | Quan et al. |
| 5,783,861 A | 7/1998 | Son |
| 5,801,440 A | 9/1998 | Chu et al. |
| 5,814,877 A | 9/1998 | Diffenderfer et al. |
| 5,814,881 A | 9/1998 | Alagaratnam et al. |
| 5,814,883 A | 9/1998 | Sawai et al. |
| 5,814,884 A | 9/1998 | Davis et al. |
| 5,817,540 A | 10/1998 | Wark |
| 5,818,105 A | 10/1998 | Kouda |
| 5,821,457 A | 10/1998 | Mosley et al. |
| 5,821,615 A | 10/1998 | Lee |
| 5,834,830 A | 11/1998 | Cho |
| 5,835,988 A | 11/1998 | Ishii |
| 5,844,306 A | 12/1998 | Fujita et al. |
| 5,856,911 A | 1/1999 | Riley |
| 5,859,471 A | 1/1999 | Kuraishi et al. |
| 5,866,939 A | 2/1999 | Shin et al. |
| 5,871,782 A | 2/1999 | Choi |
| 5,874,784 A | 2/1999 | Aoki et al. |
| 5,877,043 A | 3/1999 | Alcoe et al. |
| 5,886,397 A | 3/1999 | Ewer |
| 5,886,398 A | 3/1999 | Low et al. |
| 5,894,108 A | 4/1999 | Mostafazadeh et al. |
| 5,897,339 A | 4/1999 | Song et al. |
| 5,900,676 A | 5/1999 | Kweon et al. |
| 5,903,049 A | 5/1999 | Mori |
| 5,903,050 A | 5/1999 | Thurairajaratnam et al. |
| 5,909,053 A | 6/1999 | Fukase et al. |
| 5,915,998 A | 6/1999 | Stidham et al. |
| 5,917,242 A | 6/1999 | Ball |
| 5,939,779 A | 8/1999 | Kim |
| 5,942,794 A | 8/1999 | Okumura et al. |
| 5,951,305 A | 9/1999 | Haba |
| 5,959,356 A | 9/1999 | Oh |
| 5,969,426 A | 10/1999 | Baba et al. |
| 5,973,388 A | 10/1999 | Chew et al. |
| 5,976,912 A | 11/1999 | Fukutomi et al. |
| 5,977,613 A | 11/1999 | Takata et al. |
| 5,977,615 A | 11/1999 | Yamaguchi et al. |
| 5,977,630 A | 11/1999 | Woodworth et al. |
| 5,981,314 A | 11/1999 | Glenn et al. |
| 5,986,333 A | 11/1999 | Nakamura |

| | | | | | | |
|---|---|---|---|---|---|---|
| 5,986,885 | A | 11/1999 | Wyland | 6,316,838 B1 | 11/2001 | Ozawa et al. |
| 6,001,671 | A | 12/1999 | Fjelstad | 6,323,550 B1 | 11/2001 | Martin et al. |
| 6,013,947 | A | 1/2000 | Lim | 6,326,243 B1 | 12/2001 | Suzuya et al. |
| 6,018,189 | A | 1/2000 | Mizuno | 6,326,244 B1 | 12/2001 | Brooks et al. |
| 6,020,625 | A | 2/2000 | Qin et al. | 6,326,678 B1 | 12/2001 | Karmezos et al. |
| 6,025,640 | A | 2/2000 | Yagi et al. | 6,335,564 B1 | 1/2002 | Pour |
| 6,031,279 | A | 2/2000 | Lenz | 6,337,510 B1 | 1/2002 | Chun-Jen et al. |
| RE36,613 | E | 3/2000 | Ball | 6,339,255 B1 | 1/2002 | Shin |
| 6,034,423 | A | 3/2000 | Mostafazadeh et al. | 6,348,726 B1 | 2/2002 | Bayan et al. |
| 6,040,626 | A | 3/2000 | Cheah et al. | 6,355,502 B1 | 3/2002 | Kang et al. |
| 6,043,430 | A | 3/2000 | Chun | 6,369,447 B2 | 4/2002 | Mori |
| 6,060,768 | A | 5/2000 | Hayashida et al. | 6,369,454 B1 | 4/2002 | Chung |
| 6,060,769 | A | 5/2000 | Wark | 6,373,127 B1 | 4/2002 | Baudouin et al. |
| 6,072,228 | A | 6/2000 | Hinkle et al. | 6,380,048 B1 | 4/2002 | Boon et al. |
| 6,075,284 | A | 6/2000 | Choi et al. | 6,384,472 B1 | 5/2002 | Huang |
| 6,081,029 | A | 6/2000 | Yamaguchi | 6,388,336 B1 | 5/2002 | Venkateshwaran et al. |
| 6,084,310 | A | 7/2000 | Mizuno et al. | 6,395,578 B1 | 5/2002 | Shin et al. |
| 6,087,715 | A | 7/2000 | Sawada et al. | 6,400,004 B1 | 6/2002 | Fan et al. |
| 6,087,722 | A | 7/2000 | Lee et al. | 6,410,979 B2 | 6/2002 | Abe |
| 6,093,584 | A | 7/2000 | Fjelstad | 6,414,385 B1 | 7/2002 | Huang et al. |
| 6,100,594 | A | 8/2000 | Fukui et al. | 6,420,779 B1 | 7/2002 | Sharma et al. |
| 6,113,473 | A | 9/2000 | Costantini et al. | 6,429,508 B1 | 8/2002 | Gang |
| 6,114,752 | A | 9/2000 | Huang et al. | 6,437,429 B1 | 8/2002 | Su et al. |
| 6,118,174 | A | 9/2000 | Kim | 6,444,499 B1 | 9/2002 | Swiss et al. |
| 6,118,184 | A | 9/2000 | Ishio et al. | 6,448,633 B1 | 9/2002 | Yee et al. |
| RE36,907 | E | 10/2000 | Templeton, Jr. et al. | 6,452,279 B2 | 9/2002 | Shimoda |
| 6,130,115 | A | 10/2000 | Okumura et al. | 6,459,148 B1 | 10/2002 | Chun-Jen et al. |
| 6,130,473 | A | 10/2000 | Mostafazadeh et al. | 6,464,121 B2 | 10/2002 | Reijnders |
| 6,133,623 | A | 10/2000 | Otsuki et al. | 6,476,469 B2 | 11/2002 | Huang et al. |
| 6,140,154 | A | 10/2000 | Hinkle et al. | 6,476,474 B1 | 11/2002 | Hung |
| 6,143,981 | A | 11/2000 | Glenn | 6,482,680 B1 | 11/2002 | Khor et al. |
| 6,169,329 | B1 | 1/2001 | Farnworth et al. | 6,498,099 B1 | 12/2002 | McLellan et al. |
| 6,177,718 | B1 | 1/2001 | Kozono | 6,498,392 B2 | 12/2002 | Azuma |
| 6,181,002 | B1 | 1/2001 | Juso et al. | 6,507,096 B2 | 1/2003 | Gang |
| 6,184,465 | B1 | 2/2001 | Corisis | 6,507,120 B2 | 1/2003 | Lo et al. |
| 6,184,573 | B1 | 2/2001 | Pu | 6,534,849 B1 | 3/2003 | Gang |
| 6,194,777 | B1 | 2/2001 | Abbott et al. | 6,545,332 B2 | 4/2003 | Huang |
| 6,197,615 | B1 | 3/2001 | Song et al. | 6,545,345 B1 | 4/2003 | Glenn et al. |
| 6,198,171 | B1 | 3/2001 | Huang et al. | 6,559,525 B2 | 5/2003 | Huang |
| 6,201,186 | B1 | 3/2001 | Daniels et al. | 6,566,168 B2 | 5/2003 | Gang |
| 6,201,292 | B1 | 3/2001 | Yagi et al. | 6,583,503 B2 | 6/2003 | Akram et al. |
| 6,204,554 | B1 | 3/2001 | Ewer et al. | 6,586,677 B2 * | 7/2003 | Glenn ........................ 174/528 |
| 6,208,020 | B1 | 3/2001 | Minamio et al. | 6,603,196 B2 | 8/2003 | Lee et al. |
| 6,208,021 | B1 | 3/2001 | Ohuchi et al. | 6,624,005 B1 | 9/2003 | Di Caprio et al. |
| 6,208,023 | B1 | 3/2001 | Nakayama et al. | 6,635,957 B2 | 10/2003 | Kwan |
| 6,211,462 | B1 | 4/2001 | Carter, Jr. et al. | 6,667,546 B2 | 12/2003 | Huang et al. |
| 6,218,731 | B1 | 4/2001 | Huang et al. | 6,773,961 B1 * | 8/2004 | Lee et al. ..................... 438/112 |
| 6,222,258 | B1 | 4/2001 | Asano et al. | 6,777,265 B2 | 8/2004 | Islam |
| 6,222,259 | B1 | 4/2001 | Park et al. | 6,812,552 B2 * | 11/2004 | Islam et al. .................. 257/666 |
| 6,225,146 | B1 | 5/2001 | Yamaguchi et al. | 6,841,414 B1 * | 1/2005 | Hu et al. ..................... 438/106 |
| 6,229,200 | B1 | 5/2001 | Mclellan et al. | 7,087,461 B2 * | 8/2006 | Park et al. .................... 438/112 |
| 6,229,205 | B1 | 5/2001 | Jeong et al. | 7,169,651 B2 * | 1/2007 | Park et al. .................... 438/124 |
| 6,238,952 | B1 | 5/2001 | Lin | 7,189,599 B2 * | 3/2007 | Tanaka ........................ 438/123 |
| 6,239,367 | B1 | 5/2001 | Hsuan et al. | 7,205,658 B2 * | 4/2007 | Lee et al. ..................... 257/730 |
| 6,239,384 | B1 | 5/2001 | Smith et al. | 7,211,467 B2 * | 5/2007 | Park et al. .................... 438/111 |
| 6,242,281 | B1 | 6/2001 | Mclellan et al. | 2001/0008305 A1 | 7/2001 | McLellan et al. |
| 6,256,200 | B1 | 7/2001 | Lam et al. | 2001/0014538 A1 | 8/2001 | Kwan et al. |
| 6,258,629 | B1 | 7/2001 | Niones et al. | 2002/0011654 A1 | 1/2002 | Kimura |
| 6,281,566 | B1 | 8/2001 | Magni | 2002/0024122 A1 | 2/2002 | Jung et al. |
| 6,281,568 | B1 | 8/2001 | Glenn et al. | 2002/0027297 A1 | 3/2002 | Ikenaga et al. |
| 6,282,095 | B1 | 8/2001 | Houghton et al. | 2002/0140061 A1 | 10/2002 | Lee |
| 6,285,075 | B1 | 9/2001 | Combs et al. | 2002/0140068 A1 | 10/2002 | Lee et al. |
| 6,291,271 | B1 | 9/2001 | Lee et al. | 2002/0163015 A1 | 11/2002 | Lee et al. |
| 6,291,273 | B1 | 9/2001 | Miyaki et al. | 2003/0030131 A1 | 2/2003 | Lee et al. |
| 6,294,100 | B1 | 9/2001 | Fan et al. | 2003/0073265 A1 | 4/2003 | Hu et al. |
| 6,294,830 | B1 | 9/2001 | Fjelstad | 2004/0056277 A1 | 3/2004 | Karnezos |
| 6,295,977 | B1 | 10/2001 | Ripper et al. | 2004/0061212 A1 | 4/2004 | Karnezos |
| 6,297,548 | B1 | 10/2001 | Moden et al. | 2004/0061213 A1 | 4/2004 | Karnezos |
| 6,303,984 | B1 | 10/2001 | Corisis | 2004/0063242 A1 | 4/2004 | Karnezos |
| 6,303,997 | B1 | 10/2001 | Lee | 2004/0063246 A1 | 4/2004 | Karnezos |
| 6,307,272 | B1 | 10/2001 | Takahashi et al. | 2004/0065963 A1 | 4/2004 | Karnezos |
| 6,309,909 | B1 | 10/2001 | Ohgiyama | | | |
| 6,316,822 | B1 | 11/2001 | Venkateshwaran et al. | | | |

| | | | | | | |
|---|---|---|---|---|---|---|
| 2006/0170081 | A1* | 8/2006 | Gerber et al. ............... 257/666 | JP | 7297344 | 11/1995 |
| | | | | JP | 7312405 | 11/1995 |
| | | FOREIGN PATENT DOCUMENTS | | JP | 864634 | 3/1996 |
| EP | | 0393997 | 10/1990 | JP | 8083877 | 3/1996 |
| EP | | 0459493 | 12/1991 | JP | 8125066 | 5/1996 |
| EP | | 0720225 | 3/1996 | JP | 96-4284 | 6/1996 |
| EP | | 0720234 | 3/1996 | JP | 8222682 | 8/1996 |
| EP | | 0794572 A2 | 10/1997 | JP | 8306853 | 11/1996 |
| EP | | 0844665 | 5/1998 | JP | 98205 | 1/1997 |
| EP | | 0936671 | 8/1999 | JP | 98206 | 1/1997 |
| EP | | 0989608 | 3/2000 | JP | 98207 | 1/1997 |
| EP | | 1032037 | 8/2000 | JP | 992775 | 4/1997 |
| JP | | 55163868 | 12/1980 | JP | 9260568 | 10/1997 |
| JP | | 5745959 | 3/1982 | JP | 9293822 | 11/1997 |
| JP | | 58160096 | 8/1983 | JP | 10022447 | 1/1998 |
| JP | | 59208756 | 11/1984 | JP | 10163401 | 6/1998 |
| JP | | 59227143 | 12/1984 | JP | 10199934 | 7/1998 |
| JP | | 60010756 | 1/1985 | JP | 10256240 | 9/1998 |
| JP | | 60116239 | 8/1985 | JP | 11307675 | 11/1999 |
| JP | | 60195957 | 10/1985 | JP | 00150765 | 5/2000 |
| JP | | 60231349 | 11/1985 | JP | 556398 | 10/2000 |
| JP | | 6139555 | 2/1986 | JP | 2001060648 | 3/2001 |
| JP | | 61248541 | 11/1986 | JP | 200204397 | 8/2002 |
| JP | | 629639 | 1/1987 | KR | 941979 | 1/1994 |
| JP | | 6333854 | 2/1988 | KR | 19940010938 | 5/1994 |
| JP | | 63067762 | 3/1988 | KR | 19950018924 | 6/1995 |
| JP | | 63188964 | 8/1988 | KR | 19950041844 | 11/1995 |
| JP | | 63205935 | 8/1988 | KR | 19950044554 | 11/1995 |
| JP | | 63233555 | 9/1988 | KR | 19950052621 | 12/1995 |
| JP | | 63249345 | 10/1988 | KR | 1996074111 | 12/1996 |
| JP | | 63289951 | 11/1988 | KR | 9772358 | 11/1997 |
| JP | | 63316470 | 12/1988 | KR | 100220154 | 6/1999 |
| JP | | 64054749 | 3/1989 | KR | 20000072714 | 12/2000 |
| JP | | 1106456 | 4/1989 | KR | 20000086238 | 12/2000 |
| JP | | 1175250 | 7/1989 | KR | 0049944 | 6/2002 |
| JP | | 1205544 | 8/1989 | WO | 9956316 | 11/1999 |
| JP | | 1251747 | 10/1989 | WO | 9967821 | 12/1999 |
| JP | | 2129948 | 5/1990 | | | |
| JP | | 369248 | 7/1991 | | | |
| JP | | 3177060 | 8/1991 | | | |
| JP | | 4098864 | 9/1992 | | | |
| JP | | 5129473 | 5/1993 | | | |
| JP | | 5166992 | 7/1993 | | | |
| JP | | 5283460 | 10/1993 | | | |
| JP | | 6061401 | 3/1994 | | | |
| JP | | 692076 | 4/1994 | | | |
| JP | | 6140563 | 5/1994 | | | |
| JP | | 6260532 | 9/1994 | | | |

OTHER PUBLICATIONS

Vishay, "A Milliohms in the So-8: Vishay Siliconix Sets New Record for Power MOSFET On-Resistance," Press Release from webpage, 3 pages, www.vishay.com/news/releases, Nov. 7, 2002.

Patrick Mannion, "MOSFETs Break out of the Shackles of Wire Bonding," Informational Packet, 5 pages, Electronic Design, Mar. 22, 1999 vol. 47, No. 6, www.elecdesign.com/1999/mar2299/ti/0322til.shtml.

* cited by examiner

ETCH SINGULATED SEMICONDUCTOR PACKAGE

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

The present invention relates generally to semiconductor package technology, and more particularly to a unique manufacturing methodology for a semiconductor package wherein singulation is accomplished by etching as opposed to mechanical cutting (e.g, sawing or punching).

Integrated circuit dies are conventionally enclosed in plastic packages that provide protection from hostile environments and enable electrical interconnection between the integrated circuit die and an underlying substrate such as printed circuit board (PCB). The elements of such a package include a metal leadframe, an integrated circuit die, bonding material to attach the integrated circuit die to the leadframe, bond wires which electrically connect pads on the integrated circuit die to individual leads of the leadframe, and a hard plastic encapsulant material which covers the other components and forms the exterior of the package often referred to as the package body. In a cavity type semiconductor package, the package body is substituted with a prefabricated cavity which is formed on the leadframe, the die being positioned within the cavity and sealed therein by a lid or similar structure which is attached to the cavity.

The leadframe is typically the central supporting structure of a semiconductor package. A portion of the leadframe is internal to the package, i.e., completely surrounded by the plastic encapsulant package body or the prefabricated cavity. Portions of the leads of the leadframe extend externally from the package or are partially exposed within the package body or cavity for use in electrically connecting the package to another component. In certain semiconductor packages, a portion of the die pad of the leadframe also remains exposed within the package body for use as a heat sink.

For purposes of high volume, low cost production of semiconductor packages, a current industry practice is to etch or stamp a thin sheet of metal material to form a panel or strip which defines multiple leadframes. A single strip may be formed to include multiple arrays, with each such array including a multiplicity of leadframes in a particular pattern. In a typical semiconductor package manufacturing process, integrated circuit dies are mounted and wire bonded to respective ones of the leadframes, with the encapsulant material then being applied to the strip so as to encapsulate the integrated circuit dies, bond wires, and portions of each of the leadframes in the above-described manner. The hardening of the encapsulant material facilitates the formation of a mold cap upon the leadframes.

Upon the hardening of the encapsulant material, the leadframes within the strip are cut apart or singulated for purposes of producing the individual semiconductor packages. Such singulation is typically accomplished via a saw singulation process or a mechanical punching operation. In the saw singulation process, a saw blade is advanced along "saw streets" which extend in prescribed patterns between the leadframes as required to facilitate the separation of the leadframes from each other in the required manner. The advancement of the saw blade along the saw streets currently cuts the molded plastic mold cap, thus facilitating the formation of the above-described molded plastic package body upon each of the separated leadframes. With particular regard to cavity type semiconductor packages, the saw blade is advanced along the saw streets which typically extend between the various cavities formed on the strip.

One of the drawbacks associated with the saw singulation process used in relation to the manufacture of semiconductor packages is that the saw blade used in the saw singulation process cuts through copper (i.e., the metal material typically used to fabricate the strip) usually most of the time. As will be recognized, this level of sawing through copper as occurs as a result of the configuration of the strip often results in the premature wear of the costly saw singulation blades. Another drawback of the saw singulation process is that the same also typically results in the burring of the leads of the separated leadframes. Saw generated burrs at the leads often adversely affect solder mounting and joint reliability. In current semiconductor package fabrication methodologies, lead burrs are often controlled by limiting the feed rate of the saw blade along the saw streets and by using specifically developed, high cost saw blades. However, as will be recognized, the use of the high cost saw blades is undesirable due to the resultant increase in production cost, with the reduced feed rates needed to control burring also adversely affecting production speed, and thus efficiency. With particular regard to the punch singulation process, one of the drawbacks associated with the use of such process is the tendency for the hardened encapsulant material or package body of the semiconductor package to chip or crack as a result of the punching operation. As will be recognized, such chipping or cracking of the package body can result in the accelerated failure thereof as a result of, among other things, moisture permeation to the embedded integrated circuit die. Further, punch singulation is typically not preferred for applications using mechanically sensitive die due to the perceived risk associated with impact vibration (e.g., MEMS).

The present invention addresses the above-described drawbacks by providing a semiconductor package having structural attributes which are uniquely tailored such that the singulation process is achieved using etching techniques. Advantageously, etching techniques are inherently lower in cost and free from many of the defects induced by other cutting techniques (e.g., sawing, punching) as highlighted above. These, and other advantages of the present invention, will be discussed in more detail below.

BRIEF SUMMARY OF THE INVENTION

In accordance with the present invention, there is provided various methods of simultaneously fabricating a plurality of semiconductor packages (e.g., cavity type semiconductor packages) wherein the singulation process is achieved using etching techniques as opposed to more conventional cutting techniques such as sawing or punching. Such etching techniques are inherently lower in cost and free from many of the defects induced by other cutting techniques.

The present invention is best understood by reference to the following detailed description when read in conjunction with the accompanying drawings.

BRIEF DESCRIPTION OF THE DRAWINGS

These as well as other features of the present invention will become more apparent upon reference to the drawings wherein.

Common reference numerals are used throughout the drawings and detailed description to indicate like elements.

DETAILED DESCRIPTION OF THE INVENTION

Figure 1:
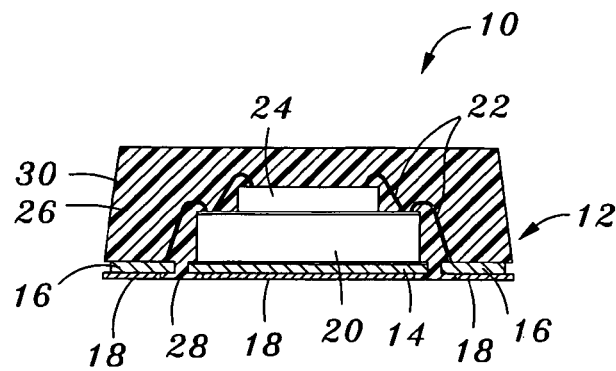
FIG. 1 is a cross-sectional view of a semiconductor package constructed in accordance with one embodiment of the present invention.

Referring now to the drawings where the showings are for purposes of illustrating various embodiments of the present invention only, and not for purposes of limiting the same, FIG. 1 illustrates a semiconductor package 10 constructed in accordance with one embodiment of the present invention. The semiconductor package 10 comprises a leadframe 12 which is preferably fabricated from a conductive metal material (e.g., copper). The leadframe 12 includes a die pad 14 which has a generally quadrangular (e.g., square, rectangular) configuration and defines opposed, generally planar top and bottom surfaces. In addition to the die pad 14, the leadframe 12 includes a plurality of leads 16. The leads 16 are typically segregated into multiple sets, with the leads 16 of each set extending along and in spaced relation to a respective one of the peripheral edge segments defined by the die pad 14. In this regard, the leadframe 12 of the semiconductor package 10 may be provided with one or more sets of leads 16, each such set extending along and in spaced relation to a respective peripheral edge segment of the die pad 14. Each of the leads 16 of the leadframe 12 is formed to define opposed, generally planar top and bottom surfaces.

In the semiconductor package 10, the bottom surfaces of the die pad 14 and each of the leads 16 each preferably include a plating layer 18 which is applied to at least a portion thereof. Each plating layer 18 may be fabricated from any one of a number of suitable conductive metal materials through the implementation of any suitable, currently known plating technique. However, it is contemplated that any material or combination of materials used to facilitate the formation of the plating layers 18 will be impervious to etching through the use of chemicals suited to the etching or removal of copper, for reasons which will be described in more detail below.

As further seen in FIG. 1, the semiconductor package 10 also includes a first semiconductor die 20 which is mounted to the top surface of the die pad 14 through the use of, for example, an adhesive. The pads of terminals of the semiconductor die 20 are electrically connected to the top surfaces of respective ones of the leads 16 through the use of conductive wires 22, though it is also contemplated that a flip chip interconnection may alternatively be used to facilitate the electrical connection of the semiconductor die 20 to the leads 16. In addition to the first semiconductor die 20, the semiconductor package 10 includes a second semiconductor die 24 which is stacked upon and attached to the first semiconductor die 20. The pads or terminals of the second semiconductor die 24 are electrically connected to corresponding pads or terminals of the first semiconductor die 20 through conductive wires 22 as well, though a flip chip interconnection may also be employed to facilitate the electrical connection of the second semiconductor die 24 to the first semiconductor die 20. Those of ordinary skill in the art will recognize that the number and arrangement of semiconductor dies within the semiconductor package 10 may be varied in accordance with a particular application therefore, the depiction of the first and second semiconductor dies 20, 24 in the semiconductor package 10 being exemplary only. In this regard, it is contemplated that one or more passive devices may also be integrated into the semiconductor package 10 in addition or as an alternative to the second semiconductor die 24.

Also included in the semiconductor package 10 is a package body 26 which is preferably fabricated from a hardened plastic encapsulant material. The package body 26 is formed to cover or encapsulate the first and second semiconductor dies 20, 24, as well as the conductive wires 22 and the exposed portions of the top and bottom surfaces of the die pad 14 and leads 16. As will be recognized, those portions of the bottom surfaces of the die pad 14 and leads 16 which are exposed are those, if any, not covered by respective ones of the plating layers 18. Due to the manner in which the package body 26 is preferably formed, the bottom surfaces of the plating layers 18 are exposed in and may be substantially flush with a generally planar bottom surface 28 defined by the body 26. The outer ends of the leads 16 (i.e., those ends of the leads 16 disposed furthest from the die pad 14) are recessed inwardly relative to a side surface 30 of the package body 26 for reasons which will also be discussed in more detail below.

Having thus described the structural attributes of the semiconductor package 10, a preferred method of fabricating the same will now be described with particular reference to FIGS. 2A and 2B. In fabricating the semiconductor package 10, a leadframe strip 32 is initially provided, a portion of such strip being shown in FIG. 2A. The strip 32 typically has a generally rectangular configuration, and defines a multiplicity of the above-described leadframes 12 which are arranged in a prescribed pattern. Within the leadframe strip 32, the leads 16 of each set within each individual leadframe 12 typically extend inwardly from a respective one of a multiplicity of connecting bar portions 34 which are defined by the leadframe strip 32, one such connecting bar portion 34 being shown in FIG. 2A. Additionally, within the leadframe strip 32, the leads 16 of each leadframe 12 typically extend about a central opening in which the die pad 14 is positioned and suspend via multiple tie bars (not shown) which extend to corresponding, adjacent connecting bar portions 34. The individual leadframes 12 within the leadframe strip 32 are typically formed through the completion of an etching or a stamping process.

Figure 2A:
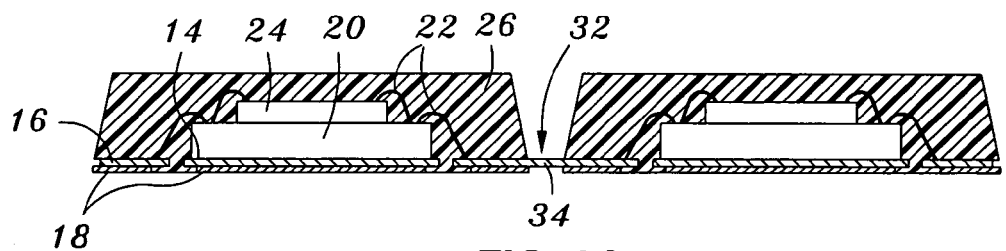
FIGS. 2A and 2B illustrate an exemplary sequence of steps which may be used to facilitate the fabrication of the semiconductor package shown in FIG. 1.

As is further seen in FIG. 2A, the leadframe strip 32 including the individual leadframes 12 is subjected to a plating process wherein the die pad 14 and leads 16 of each leadframe 12 within the leadframe strip 32 are plated with the above-described plating layers 18. More particularly, bottom surfaces of the die pad 14 and leads 16 of each leadframe 12 are selectively pre-plated to include respective ones of the plating layers 18. As seen in FIG. 2A, in the plating process, the plating layer 18 formed on the bottom surface of the die pad 14 of each leadframe 12 is preferably sized relative to the die pad 14 so as to terminate inwardly relative to the peripheral edge segments thereof. Similarly, the plating layer 18 formed on the bottom surface of each lead 16 of each leadframe 12 is preferably sized relative to the lead 16 so as to terminate inwardly from the inner end thereof which is disposed closest to the corresponding die pad 14. As such, the die pad 14 of each leadframe 12 and the corresponding plating layer 18 applied to the bottom surface thereof collectively defined a recessed shelf which extends about the periphery of the die pad 14. Similarly, each lead 16 of each leadframe 12 and the corresponding plating layer 18 applied thereto collectively define a recessed shelf which extends along at least the inner end of the lead 16.

After the plating layers 18 have been applied to the die pad 14 and leads 16 of each leadframe 12 within the leadframe strip 32 in the above-described manner, a die attach process is completed wherein the first semiconductor dies 20 are attached to the top surfaces of respective ones of the die pads 14, and the second semiconductor dies 24 (if any) are attached to the exposed top surfaces of respective ones of the underlying first semiconductor dies 20. Thereafter, a wire bonding process is completed wherein the first semiconductor dies 20 are electrically connected to the top surfaces of one or more of the leads 16 of the corresponding leadframe 12 through the use of the conductive wire(s) 22, and each second semiconductor die 24 (if included) is electrically connected by at least one conductive wire 22 to the corresponding, underlying first semiconductor die 20 and/or directly to one or more of the leads 16 of the corresponding leadframe 12.

Subsequent to the completion of the wire bonding process, a molding process is completed wherein individual package bodies 26 are formed upon the leadframe strip 32 in the manner shown in FIG. 2A. More particularly, each package body 26 is formed such that the exposed surfaces of the die pad 14 and leads 16 of the corresponding leadframe 12 are covered thereby, as are the first and second semiconductor dies 20, 24 and conductive wires 22 mounted to the corresponding leadframe 12. Each package body 26 is further formed such that the generally planar bottom surfaces of the plating layers 18 formed on the corresponding leadframe 12 are exposed in the bottom surface 28 of the package body 26. The bottom surfaces of the plating layers 18 will typically be substantially flush with the bottom surface 28 of the package body 26, though they may protrude slightly therefrom. Importantly, since the plating layers 18 are sized to cover less area than the corresponding bottom surfaces of the die pad 14 and leads 16 to which they are applied as described above, the encapsulant material used to form each individual package body 26 effectively underflows into the aforementioned recessed shelves collectively defined by the die pad 14, leads 16 and plating layers 18. Such underflow effectively creates a locking feature which assists in maintaining a firm mechanical interlock between the die pad 14 and leads 16 of each leadframe 12 and the corresponding package body 26 of the resultant semiconductor package 10.

Upon the complete formation of the individual package bodies 26 thereon, the leadframe strip 32 is subjected to a chemical etching process wherein a suitable chemical etchant is applied to the exposed connecting bar portions 34 of the leadframe strip 32. The etching may be performed using wet chemical or another etching technique. Wet etching can be performed using either immersion or spray methods. Importantly, the plating layers 18 applied to the die pad 14 and leads 16 of each leadframe 12 within the leadframe strip 32 effectively serve as an etch mask, with the removal of the connecting bar portions 34 effectuated by the application of the chemical etchant thereto effectively separating the individual semiconductor packages 10 from each other within the leadframe strip 32. In this regard, the etchants are adapted to be selective over the pre-plated finish material used for the plating layers 18.

Figure 2B:
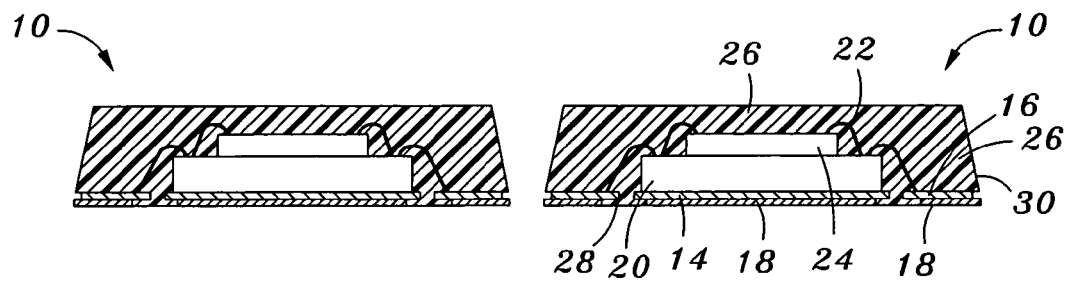

As is seen in FIGS. 1 and 2B, as a result of the singulation of the leadframe strip 32 through the completion of the chemical etching process, some undercut in the leads 16 of each leadframe 12 occurs as a result of such etching. More particularly, the outer end of each lead 16 is recessed slightly inwardly from the side surface 30 of the corresponding package body 26. The outer end of each lead 16 is also recessed slightly inwardly from the outer end of the corresponding plating layer 18 applied thereto, such plating layer 18 being unaffected by the etchant. It is contemplated that such undercut in each of the leads 16 may be minimized by using a leadframe strip 32 in the fabrication process wherein the individual leadframes 12 thereof are already subjected to a half-etching process for purposes of forming recessed shelves within the die pad 14 and leads 16 thereof as needed to create firm mechanical interlocks to the corresponding package body 26. The undercuts, if present in the resultant semiconductor package 10, may serve as solder fillets, thus enhancing the solder joint reliability between the semiconductor package 10 and an underlying substrate such as a printed circuit board when the semiconductor package 10 is mounted thereto. Further, since the plating layers 18 applied to the die pad 14 and leads 16 of each leadframe 12 serve as an etch resist, the etching of the connecting bar portions 34 may occur from either or both sides of the leadframe strip 32.

Figure 3:
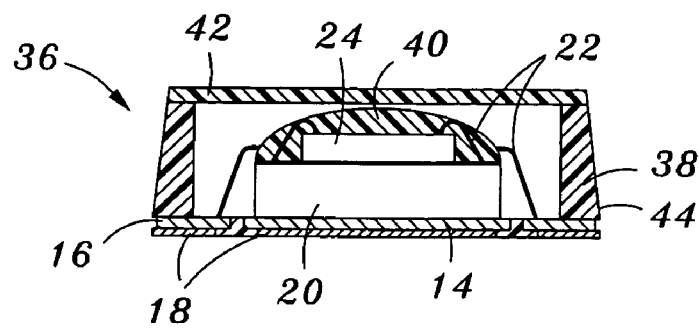
FIG. 3 is a cross-sectional view of a semiconductor package constructed in accordance with another embodiment of the present invention.

Referring now to FIG. 3, there is shown a semiconductor package 36 constructed in accordance with another embodiment of the present invention. The semiconductor package 36 is substantially similar in construction to the semiconductor package 10, with the primary distinction being that the package body 26 in the semiconductor package 10 is substituted with a cavity 38 in the semiconductor package 36. The cavity 38 is formed to include portions which extend between and thus fill the gaps or voids defined between the leads 16 and between the leads 16 and the die pad 14 of the corresponding leadframe 12. Thus, the generally planar bottom surfaces of the plating layers 18 formed on the bottom surfaces of the die pad 14 and leads 16 are exposed in and typically substantially flush or continuous with the generally planar bottom surface of the cavity 38. In the semiconductor package 36, the first semiconductor die 20, the second semiconductor die 24 (if included) and the conductive wire(s) 22 are each disposed within the interior of cavity 38. The points of connection between the conductive wires 22 and the corresponding pads or terminals of the first and second semiconductor dies 20, 24 are covered with a layer 40 of protective material. A lid is attached to the upper rim of the cavity 38, with the first and second semiconductor dies 20, 24 and conductive wires 22 thus being enclosed and sealed within the interior chamber collectively defined by the leadframe 12, cavity 38 and lid 42.

The manufacturing process for the semiconductor package 36 is similar to that described above in relation to the semiconductor package 10, with the primary being distinction being that the molding step used to facilitate the formation of the package bodies 26 upon the leadframe strip 32 is substituted with a molding step wherein the individual cavities 38 are formed upon respective ones of the leadframes 12 of the leadframe strip 32 in the manner shown in FIG. 3 and described above. Subsequent to the formation of the individual cavities 38 upon each of the leadframes 12 of the leadframe strip 32, the die attach and the wire bonding processes described above in relation to the semiconductor package 10 are completed, with the layer 40 of protective material then being applied to the first and second semiconductor dies 20, 24 and conductive wires 22 mounted to each leadframe 12. The lids 42 are then attached to respective ones of the cavities 38 for purposes of enclosing the corresponding first and second semiconductor dies 20, 24 therein. The above-described etching process is then completed to effectively separate the semiconductor packages 36 from each other. As in the semiconductor package 10 described above, the completion of the etching process in relation to the semiconductor packages 36 results in each of the leads 16 of each semiconductor package 36 including the aforementioned undercut, i.e., the outer end of each lead 16 of the semiconductor package 36 is slightly recessed inwardly relative to the outer surface or wall 44 of the corresponding cavity 38.

Figure 4:
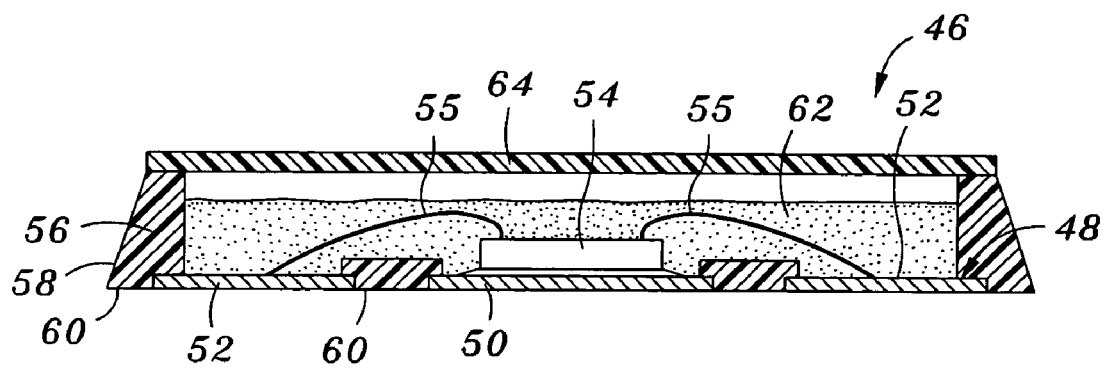
FIG. 4 is a cross-sectional view of a semiconductor package constructed in accordance with yet another embodiment of the present invention.

Referring now to FIG. 4, there is shown a semiconductor package 46 constructed in accordance with yet another embodiment of the present invention. The semiconductor package 46 comprises a leadframe 48 preferably fabricated from a conductive metal material. The leadframe 48 includes a die pad 50 which has a generally quadrangular (e.g., square, rectangular) configuration and defines opposed, generally planar top and bottom surfaces. In addition to the die pad 50, the leadframe 48 includes a plurality of leads 52. The leads 52 are typically segregated into multiple sets, with the leads 52 of each set extending along and in spaced relation to a respective one of the peripheral edge segments defined by the die pad 50. In this regard, the leadframe 48 may be provided with one or more sets of leads 52, each such set extending along and in spaced relation to a respective peripheral edge segment of the die pad 50. Each of the leads 52 of the leadframe 48 is formed to define opposed, generally planar top and bottom surfaces.

As further seen in FIG. 4, the semiconductor package 46 also includes a semiconductor die 54 which is mounted to the top surface of the die pad 50 through the use of, for example, an adhesive. The pads of terminals of the semiconductor die 54 are electrically connected to the top surfaces of respective ones of the leads 52 through the use of conductive wires 55.

Also included in the semiconductor package 46 is a cavity 56 which is preferably fabricated from a hardened plastic encapsulant material such a liquid crystal polymer (LCP). As seen in FIG. 4, the cavity 56 is uniquely configured such that portions 56a thereof extend within and thus fill the gaps or voids which are normally defined between the leads 52, and between the leads 52 and the die pad 50. In this regard, the cavity 56 is formed to cover the outer end of each of the leads 52 (i.e., the end disposed furthest from the die pad 50) as well as an outer end portion of the top surface of each of the leads 52. Also covered by the cavity 56 is the opposite inner end of each of the leads 52, the peripheral edge of the die pad 58, the peripheral portion of the top surface of the die pad 50, and an inner end portion of the top surface of each of the leads 52. Though not shown, the side edges of each of the leads 52 and portion of the top surfaces of each of the leads 52 extending along the side edges thereof may also be covered by the cavity 56. The cavity 56 defines an angled or sloped outer surface 58, and a generally planar bottom surface 60 which is typically substantially flush or continuous with the generally planar bottom surfaces of the leads 52 and die pad 50 of the leadframe 48.

In the semiconductor package 46, the exposed portions of the top surfaces of the leads 52 and die pad 50 of the leadframe 48, the semiconductor die 54, and the conductive wires 55 may be covered by an epoxy fill layer 62 which effectively protects the same. Attached to the upper rim of the cavity 56 is a lid 64 which effectively encloses and seals the semiconductor die 54 and conductive wires 55 (which are covered by the layer 62) in the interior chamber collectively defined by the leadframe 48, cavity 56 and lid 64. Though not shown, in the event the semiconductor package 46 is intended to have pressure sensing capabilities, it is contemplated that the layer 62 may be formed as a gel having a low modulus which is capable of transmitting pressure, the lid 64 being vented to allow for the application of varying pressure levels to the layer 62.

Figure 5A:
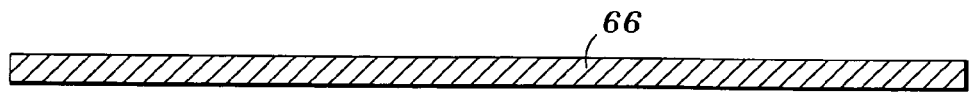
FIGS. 5A-5E illustrate an exemplary sequence of steps which may be used to facilitate the fabrication of the semiconductor package shown in FIG. 4.
Figure 5B:
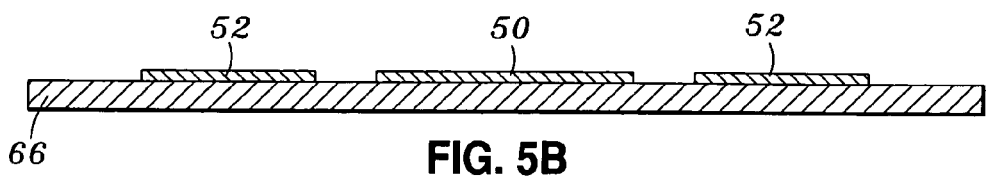

Having thus described the structural attributes of the semiconductor package 46, a preferred method of fabricating the same will now be described with particular reference to FIGS. 5A-5E. In fabricating the semiconductor package 46, a solid base strip 66 which is preferably fabricated from copper is initially provided (FIG. 5A). The base strip 66 is subjected to a plating process wherein the die pad 50 and leads 52 of the leadframe 48 are formed on the generally planar top surface of the base strip 66 (FIG. 5B). More particularly, it is contemplated that the die pad 50 and leads 52 will be formed by plating up Au/Pd/Ni/Cu/Ni/Pd/Au to a total thickness in the range of approximately 50-200 microns.

Figure 5C:
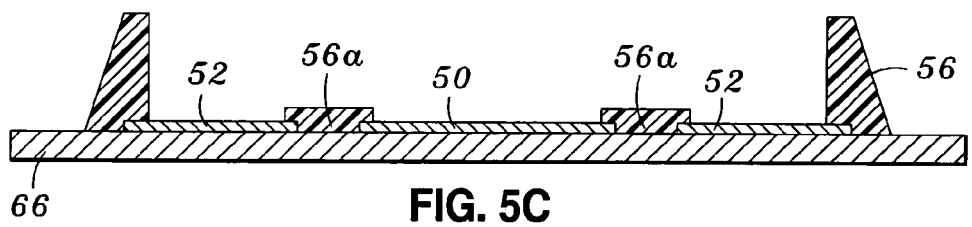

Upon the completion of the plate up process to form the die pad 50 and leads 52 of the leadframe 48, a molding process is completed to facilitate the formation of the cavity 56 upon the leadframe 48 and base strip 66 in the above-described manner (FIG. 5C). As indicated above, portions of the cavity 56 are formed between and thus fill the gaps or voids defined between the leads 52 and between the leads 52 and die pad 50.

Figure 5D:
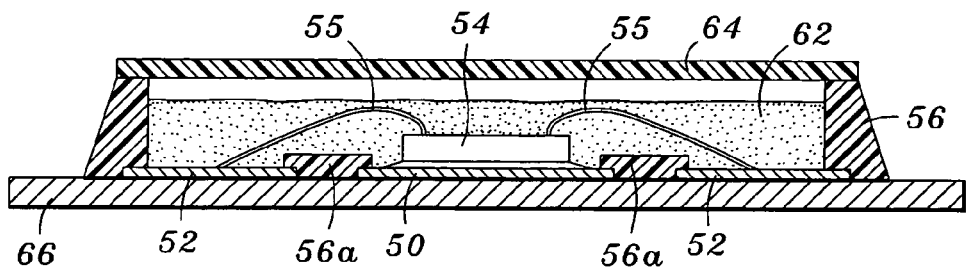

After the cavity 56 has been formed on the leadframe 48 and base strip 66 in the above-described manner, a die attach process is completed wherein the semiconductor die 54 is attached to the top surface of the die pad 50 (FIG. 5D). Thereafter, a wire bonding process is completed wherein the semiconductor die 54 is electrically connected to the top surfaces of one or more of the leads 52 through the use of the conductive wire(s) 55. Subsequent to the completion of the wire bonding process, the layer 62 of die encapsulant (e.g., an epoxy fill or gel) is placed into the cavity 56 so as to effectively cover the semiconductor 54 and conductive wires 55 in the manner also shown in FIG. 5D. The lid 64 is then attached to the upper rim of the cavity 56 thereby effectively sealing the semiconductor die 54 and conductive wires 55 within the interior chamber collectively defined by the leadframe 48, cavity 56 and lid 64.

Figure 5E:
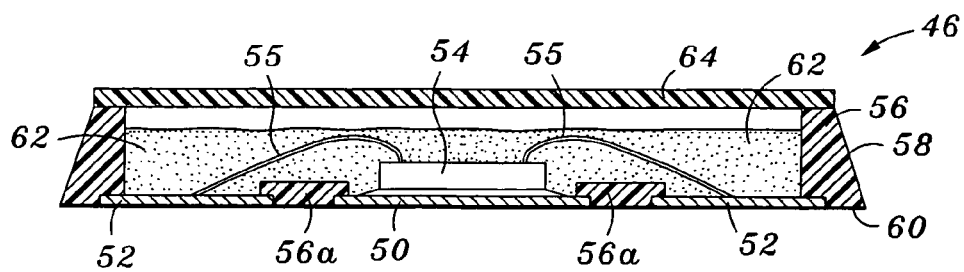

Subsequent to the attachment of the lid 64 to the cavity 56, the base strip 66 is subjected to a chemical etching process wherein a suitable chemical etchant is applied thereto. The etching may be performed using wet chemical or another etching technique. Wet etching can be performed using either immersion or spray methods. The application of the etchant to the base strip 66 effectively removes the same its entirety, thus completing the formation of the semiconductor package 46 (FIG. 5E). The metal material used to form the die pad 50 and leads 52 of the leadframe 48 and plastic material used to form the cavity 56 are unaffected by the etchant used to remove the base strip 66, thus resulting in the generally planar bottom surfaces of the die pad 50 and leads 52 being exposed in and substantially flush or continuous with the generally planar bottom surface 60 of the cavity 56 as shown in FIGS. 4 and 5E.

Figure 6:
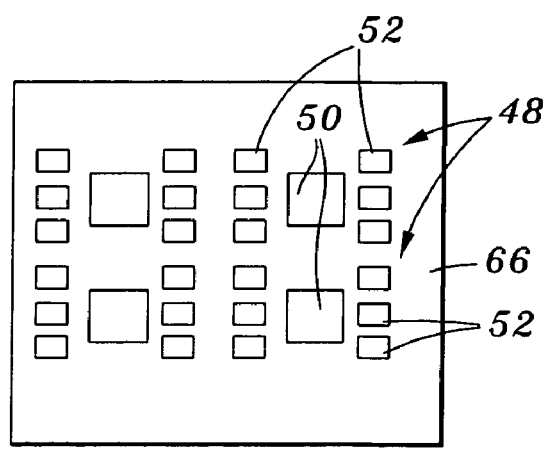
FIG. 6 is a top plan view of a patterned leadframe strip used to facilitate the simultaneous fabrication of multiple semiconductor packages each having the structural attributes shown in FIG. 4.

Referring now to FIG. 6, though the fabrication of only a single semiconductor package 46 is shown in FIGS. 5A-5E, it is contemplated that the manufacturing process for the semiconductor package 46 as described above will be conducted in a manner adapted to facilitate the simultaneous formation of multiple semiconductor packages 46. In this regard, the base strip 66 will be provided in a size sufficient to allow for the formation of multiple leadframes 48 thereon in the manner shown in FIG. 6. The subsequent assembly steps for the semiconductor packages 46 are completed in the same manner described above, the cavities 56 being formed on corresponding leadframes 48 of the enlarged base strip 66. The singulation step accomplished by the ultimate removal of the enlarged base strip 66 through the application of the chemical etchant thereto effectively separates the completed semiconductor packages 46 from each other.

Referring now to FIGS. 7A-7E there is shown a sequence of steps which may be used to facilitate the fabrication of a semiconductor package 70 (shown in its completed state in FIG. 7E) constructed in accordance with yet another embodiment of the present invention. The semiconductor package 70 comprises a leadframe 72 preferably fabricated from a conductive metal material. The leadframe 72 includes a die pad 74 which has a generally quadrangular (e.g., square, rectangular) configuration and defines opposed, generally planar top and bottom surfaces. In addition to the die pad 74, the leadframe 72 includes a plurality of leads 76. The leads 76 are typically segregated into multiple sets, with the leads 76 of each set extending along and in spaced relation to a respective one of the peripheral edge segments defined by the die pad 74. In this regard, the leadframe 72 may be provided with one or more sets of leads 76, each such set extending along and in spaced relation to a respective peripheral edge segment of the die pad 74. Each of the leads 76 of the leadframe 72 is formed to define opposed, generally planar top and bottom surfaces. The semiconductor package 70 also includes a semiconductor die 78 which is mounted to the top surface of the die pad 74 through the use of, for example, an adhesive. The pads of terminals of the semiconductor die 78 are electrically connected to the top surfaces of respective ones of the leads 76 through the use of conductive wires 80.

Also included in the semiconductor package 70 is a package body 82 which is preferably fabricated from a hardened plastic encapsulant material such a liquid crystal polymer (LCP). The package body 82 fills the gaps or voids which are normally defined between the leads 76, and between the leads 76 and the die pad 74. More particularly, the package body 82 covers the exposed portions of the top surfaces of the die pad 74 and the leads 76, the peripheral edge of the die pad 74, and the inner end (closest to the die pad 74) and opposed side edges of each of the leads 76. The package body 82 defines a generally planar top surface 84, a generally planar bottom surface 86 which is typically substantially flush or continuous with the generally planar bottom surfaces of the leads 76 and die pad 74 of the leadframe 72, and an angled or sloped outer surface 88 which extends between the top and bottom surfaces 84, 86. In the semiconductor package 70, the semiconductor die 78 and the conductive wires 80 are also covered by the package body 82.

Figure 7A:
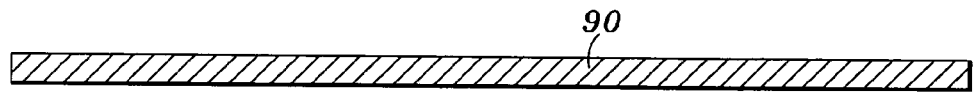
FIGS. 7A-7E illustrate an exemplary sequence of steps which may be used to facilitate the fabrication of a semiconductor package constructed in accordance with yet another embodiment of the present invention.
Figure 7B:
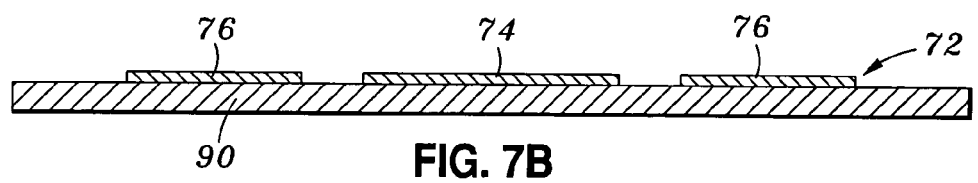

In fabricating the semiconductor package 70, a solid base strip 90 which is preferably fabricated from copper is initially provided (FIG. 7A). The base strip 90 is subjected to a plating process wherein the die pad 74 and leads 76 of the leadframe 72 are formed on the generally planar top surface of the base strip 90 (FIG. 7B). More particularly, it is contemplated that the die pad 74 and leads 76 will be formed by plating up Au/Pd/Ni/Cu/Ni/Pd/Au to a total thickness in the range of approximately 50-200 microns.

Figure 7C:
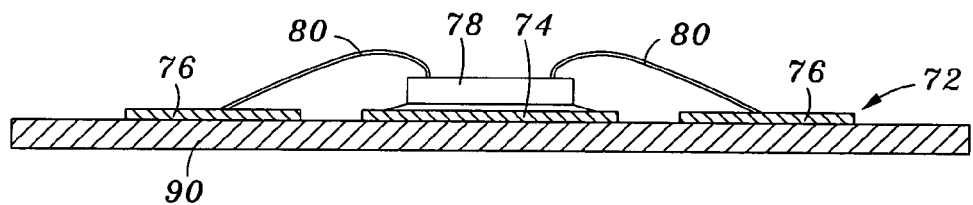
Figure 7D:
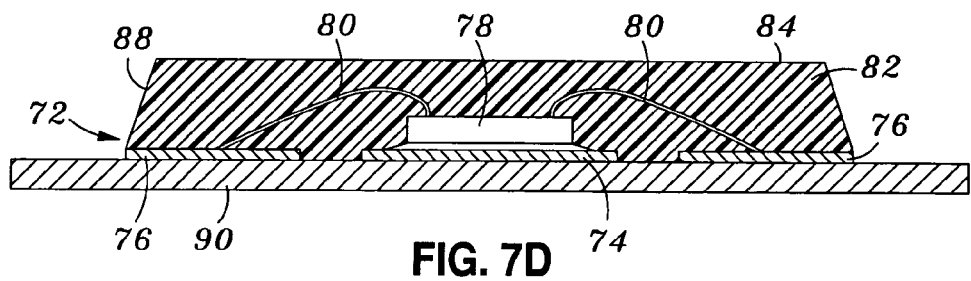

Upon the completion of the plate up process to form the die pad 74 and leads 76 of the leadframe 72, a die attach process is completed wherein the semiconductor die 78 is attached to the top surface of the die pad 74 (FIG. 7C). Thereafter, a wire bonding process is completed wherein the semiconductor die 78 is electrically connected to the top surfaces of one or more of the leads 76 through the use of the conductive wire(s) 80. A molding process is then completed to facilitate the formation of the package body 82 upon the leadframe 72 and base strip 90 in the above-described manner (FIG. 7D).

Figure 7E:
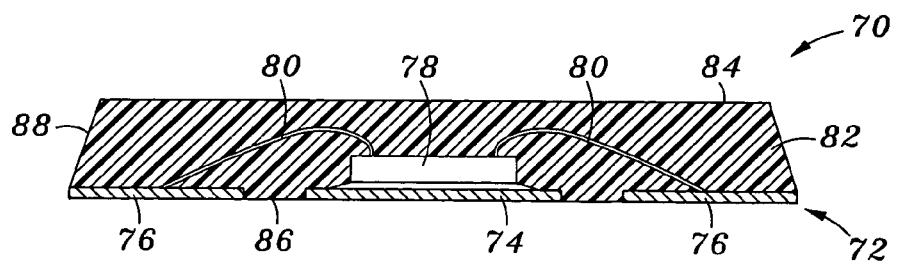

Subsequent to formation of the package body 82, the base strip 90 is subjected to a chemical etching process wherein a suitable chemical etchant is applied thereto. The etching may be performed using wet chemical or another etching technique. Wet etching can be performed using either immersion or spray methods. The application of the etchant to the base strip 90 effectively removes the same its entirety, thus completing the formation of the semiconductor package 70 (FIG. 7E). The metal material used to form the die pad 74 and leads 76 of the leadframe 72 and plastic material used to form the package body 82 are unaffected by the etchant used to remove the base strip 90, thus resulting in the generally planar bottom surfaces of the die pad 74 and leads 76 being exposed in and substantially flush or continuous with the generally planar bottom surface 86 of the package body 82.

Though the fabrication of only a single semiconductor package 70 is shown in FIGS. 7A-7E, it is contemplated that the manufacturing process for the semiconductor package 70 as described above will be conducted in a manner adapted to facilitate the simultaneous formation of multiple semiconductor packages 70. In this regard, the base strip 90 will be provided in a size sufficient to allow for the formation of multiple leadframes 72 thereon in the manner identical to that shown in FIG. 6. The subsequent assembly steps for the semiconductor packages 70 are completed in the same manner described above, the package bodies 82 being formed on corresponding leadframes 72 of the enlarged base strip 90. The singulation step accomplished by the ultimate removal of the enlarged base strip 90 through the application of the chemical etchant thereto effectively separates the completed semiconductor packages 70 from each other.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process, may be implemented by one skilled in the art in view of this disclosure.

What is claimed is:

1. A method of fabricating a semiconductor package, comprising the steps of:
    a) providing a leadframe strip having a plurality of leadframes formed therein, each of the leadframes including:
        a die pad having opposed top and bottom surfaces, and a peripheral edge; and
        a plurality of leads disposed in spaced relation to the die pad, each of the leads having opposed top and bottom surfaces and an inner end;
    b) applying plating layers to the bottom surface of the die pad and the bottom surfaces of the leads in each of the leadframes such that the plating layers serve as an etch mask;
    c) attaching semiconductor dies to respective ones of the die pads;

d) electrically connecting the semiconductor dies to the leads of respective ones of the leadframes;

e) forming a plurality of package bodies on the leadframe strip to at least partially encapsulate the leadframes and the semiconductor dies; and f) etching away portions of the leadframe strip which extend between the leadframes and are not covered by the plating layers and the package bodies to separate the leadframes from each other.

2. The method of claim 1 wherein step (b) comprises applying the plating layers to the bottom surface of the die pad and the bottom surfaces of the leads of each of the leadframes such that the plating layers terminate inwardly from the peripheral edges of respective ones of the die pads and the inner ends of respective ones of the leads.

3. The method of claim 1 wherein step (c) comprises bonding the semiconductor dies to respective ones of the die pads.

4. The method of claim 1 wherein:
step (d) comprises electrically connecting the semiconductor dies to the leads of respective ones of the leadframes through the use of conductive wires; and
step (e) comprises forming the plurality of package bodies on the leadframe strip to at least partially encapsulate the leadframes, the semiconductor dies and the conductive wires.

5. The method of claim 1 wherein step (e) comprises forming the plurality of package bodies on the leadframe strip such that portions of each of the package bodies extend between the leads and the die pad of a respective one of the leadframes.

6. The method of claim 1 wherein step (f) is performed using a wet chemical etching technique.

7. A method of fabricating a semiconductor package, comprising the steps of:
a) providing a leadframe strip having a plurality of leadframes formed therein, each of the leadframes including:
a die pad having opposed top and bottom surfaces, and a peripheral edge; and
a plurality of leads disposed in spaced relation to the die pad, each of the leads having opposed top and bottom surfaces and an inner end;
b) applying plating layers to the bottom surface of the die pad and the bottom surfaces of the leads in each of the leadframes such that the plating layers serve as an etch mask;
c) attaching semiconductor dies to respective ones of the die pads;
d) electrically connecting the semiconductor dies to the leads of respective ones of the leadframes; and
e) creating a plurality of protective structures on the leadframe strip to at least partially cover respective ones of the leadframes and corresponding ones of the semiconductor dies; and
f) etching away portions of the leadframe strip which extend between the leadframes and are not covered by the plating layers and the protective structures to separate the leadframes from each other.

8. The method of claim 7 wherein step (d) comprises electrically connecting the semiconductor dies to the leads of respective ones of the leadframes through the use of conductive wires.

9. The method of claim 8 wherein step (e) comprises forming a plurality of package bodies on the leadframe strip to at least partially encapsulate respective ones of the leadframes and corresponding ones of the semiconductor dies.

10. The method of claim 7 wherein (b) comprises applying the plating layers to the bottom surface of the die pad and the bottom surfaces of the leads of each of the leadframes such that the plating layers terminate inwardly from the peripheral edges of respective ones of the die pads and the inner ends of respective ones of the leads.

11. The method of claim 7 wherein step (e) comprises forming a plurality of cavities on the leadframe strip to at least partially encapsulate respective ones of the leadframes and circumvent corresponding ones of the die pads.

12. The method of claim 7 wherein step (c) comprises bonding the semiconductor dies to respective ones of the die pads.

13. The method of claim 11 wherein step (e) further comprises forming the plurality of cavities on the leadframe strip such that portions of each of the cavities extend between the leads and the die pad of a respective one of the leadframes.

14. The method of claim 7 wherein step (f) is performed using a wet chemical etching technique.

15. A method of fabricating a semiconductor package, comprising the steps of:
a) providing a leadframe strip having a plurality of leadframes formed therein;
b) applying plating layers to each of the leadframes such that the plating layers serve as an etch mask;
c) electrically connecting semiconductor dies to respective ones of the leadframes;
d) forming a plurality of package bodies on the leadframe strip to at least partially encapsulate respective ones of the leadframes and corresponding ones of the semiconductor dies; and
e) etching away portions of the leadframe strip which extend between the leadframes to separate the leadframes from each other.

16. The method of claim 15 wherein step (c) comprises bonding the semiconductor dies to portions of respective ones of the leadframes.

17. The method of claim 15 wherein:
step (c) comprises electrically connecting the semiconductor dies to portions of respective ones of the leadframes through the use of conductive wires; and
step (d) comprises forming the plurality of package bodies on the leadframe strip to at least partially encapsulate the leadframes, the semiconductor dies and the conductive wires.

18. The method of claim 15 wherein:
step (a) comprises providing a leadframe strip wherein each of the leadframes is formed to define a die pad having a bottom surface and a peripheral edge, and a plurality of leads disposed in spaced relation to the die pad, each of the leads having a bottom surface and an inner end; and
step (c) comprises mounting the semiconductor dies to respective ones of the die pads and electrically connecting the semiconductor dies to the leads of respective ones of the leadframes.

19. The method of claim 15 wherein step (e) is performed using a wet chemical etching technique.

20. The method of claim 16 wherein (b) comprises applying the plating layers to the bottom surface of the die pad and the bottom surfaces of the leads of each of the leadframes such that the plating layers terminate inwardly from the peripheral edges of respective ones of the die pads and the inner ends of respective ones of the leads.

* * * * *